United States Patent
Lin et al.

(10) Patent No.: US 10,256,030 B2
(45) Date of Patent: *Apr. 9, 2019

(54) FLEXIBLE PLATE ADAPTED TO BE USED IN WINGED COIL STRUCTURE, WINGED COIL STRUCTURE, AND METHOD OF MANUFACTURING WINGED COIL STRUCTURE

(71) Applicant: KINSUS INTERCONNECT TECHNOLOGY CORP., Taoyuan (TW)

(72) Inventors: Ting-Hao Lin, Taipei (TW); Chiao-Cheng Chang, Taoyuan (TW); Yi-Nong Lin, Keelung (TW)

(73) Assignee: KINSUS INTERCONNECT TECHNOLOGY CORP., Taoyuan (TW)

( * ) Notice: Subject to any disclaimer, the term of this patent is extended or adjusted under 35 U.S.C. 154(b) by 0 days.

This patent is subject to a terminal disclaimer.

(21) Appl. No.: 15/811,317

(22) Filed: Nov. 13, 2017

(65) Prior Publication Data

US 2018/0068777 A1    Mar. 8, 2018

Related U.S. Application Data

(63) Continuation of application No. 14/877,981, filed on Oct. 8, 2015.

(51) Int. Cl.
*H01F 5/00* (2006.01)
*H01F 27/28* (2006.01)
(Continued)

(52) U.S. Cl.
CPC ....... *H01F 27/2804* (2013.01); *H01F 41/041* (2013.01); *H05K 1/00* (2013.01);
(Continued)

(58) Field of Classification Search
CPC ......... H01F 2027/2809; H01F 27/2804; H01F 41/041
(Continued)

(56) References Cited

U.S. PATENT DOCUMENTS

8,325,003 B2 * 12/2012 Wu ..................... H01F 17/0013
333/181
(Continued)

*Primary Examiner* — Ronald Hinson
(74) *Attorney, Agent, or Firm* — Innovation Capital Law Group, LLP; Vic Lin (57) ABSTRACT

A winged coil structure and a method of manufacturing the same are disclosed. The winged coil structure includes an upper flexible plate, at least one upper magnetic induction coil, at least one upper connection pad, a lower flexible plate, at least one lower magnetic induction coil, at least one lower connection pad, at least one gold finger, a dielectric layer and at least one connection plug. The connection plug connects the upper connection pad and the lower connection pad through thermal pressing such that the gold finger, the upper magnetic induction coil, the upper connection pad, the lower connection pad, the connection plug, the lower connection pad and the lower magnetic induction coil are electrically connected. The upper flexible plate is provided with notched lines to be easily bent without damage to the upper and lower magnetic induction coils. Thus, a bendable feature for magnetic induction coils is provided.

9 Claims, 9 Drawing Sheets

(51) Int. Cl.
*H01F 41/04* (2006.01)
*H05K 1/00* (2006.01)
*H05K 3/00* (2006.01)
*H05K 1/16* (2006.01)
*H05K 3/46* (2006.01)

(52) U.S. Cl.
CPC ............... *H05K 1/165* (2013.01); *H05K 3/00* (2013.01); *H05K 3/4635* (2013.01); *H01F 2027/2809* (2013.01); *H05K 2201/09063* (2013.01)

(58) Field of Classification Search
USPC ........................................ 336/200, 223, 232
See application file for complete search history.

(56) References Cited

U.S. PATENT DOCUMENTS

| | | | |
|---|---|---|---|
| 8,373,534 B2* | 2/2013 | Kawarai | H01F 17/0013 29/602.1 |
| 8,819,920 B2* | 9/2014 | Yoon | H01F 41/041 29/602.1 |
| 9,301,405 B1* | 3/2016 | Lin | H05K 3/429 |
| 9,439,290 B1* | 9/2016 | Lin | H05K 1/028 |
| 9,847,165 B2* | 12/2017 | Lin | H01F 27/2804 |
| 2003/0011458 A1* | 1/2003 | Nuytkens | H01F 27/24 336/200 |
| 2004/0178875 A1* | 9/2004 | Saito | G01R 15/181 336/200 |
| 2006/0038649 A1* | 2/2006 | Mehrotra | H01F 27/2804 336/83 |
| 2008/0253149 A1* | 10/2008 | Matumoto | H01F 27/2804 363/21.06 |
| 2010/0219926 A1* | 9/2010 | Willers | H01F 27/06 336/200 |
| 2011/0102121 A1* | 5/2011 | Otsuka | H01F 27/06 336/192 |
| 2011/0140824 A1* | 6/2011 | Herhold | H01F 27/2804 336/200 |

* cited by examiner

FIG. 7D

FLEXIBLE PLATE ADAPTED TO BE USED IN WINGED COIL STRUCTURE, WINGED COIL STRUCTURE, AND METHOD OF MANUFACTURING WINGED COIL STRUCTURE

CROSS-REFERENCES TO RELATED APPLICATION

This application is a continuation application of U.S. application Ser. No. 14/877,981 filed in United States on Oct. 8, 2015, the entire contents of which are hereby incorporated by reference.

BACKGROUND OF THE INVENTION

1. Field of the Invention

The present invention generally relates to a flexible plate adapted to be used in a winged coil structure, the winged coil structure, and a method of manufacturing the winged coil structure, and more specifically to a winged coil structure having upper and lower connection pads tightly combined by connection plugs through thermal pressing, and provided with notched lines at upper flexible plate to facilitate two side regions of the upper flexible plate to bend for implementing a flexible, bendable feature, and a function of magnetic induction, and a method of manufacturing the winged coil structure.

2. The Prior Arts

In general, any electric or electronic device needs a circuit board to accommodate and connect various elements. With good mechanical strength and electrical insulation, rigid circuit boards like epoxy boards have been widely used. However, the general rigid circuit board is flat and not bendable. As a result, the traditional rigid board sometimes fails to meet the specific geometry of the actual application for saving space. For instance, mobile phones provide very limited available area to install electric or electronic elements. Thus, it is needed for a plate with workability of flexibility and bending. This is so called flexible boards. The manufacturing processes for the flexible boards have been developed for years, and very mature and reliable.

Additionally, many circuits need the inductors to exhibit inductive property, and the specific coils like magnetic induction coils are used. In the traditional technology, copper metal or alloy is usually employed to form helical patterns as the coils by etching or electroplating, and the mechanical or laser drilling process is then used to form through-holes. The coils and the flexible plates are often provided by different manufacturers and the respective through-holes are formed before shipment. It is needed to attach the coils and the flexible plates to form the circuit board as desired. As a result, the additional process of attaching is required. While the coils being attached to the respective flexible plate, the problem of alignment mismatch or alignment tolerance for the respective through-holes may adversely affect the whole electrical performance of the circuit board.

Moreover, several coils are usually manufactured on the same surface of the flexible plate in traditional process to enlarge the effective range of magnetic induction as much as possible. The overall occupied area, however, increases, and it is adverse to the actual application.

Therefore, it is greatly needed to provide a new winged coil structure and a method of manufacturing the same. The connection plug possessing the aspect of workability of thermal process is employed to tightly combine the upper and lower connection pads, and the notched lines on the upper flexible plate help two side regions of the flexible plate being easily bent upwards or downwards. The winged coil structure exhibits the flexible and bendable feature. In particular, the upper, lower and bottom magnetic induction coils are integrated as a multiple layers stack structure without concern about alignment tolerance for the respective holes while combining the individual coil and plate. The effect of magnetic induction is greatly enhanced, thereby overcoming the above problems in the prior arts.

SUMMARY OF THE INVENTION

In view of this, one embodiment of the disclosure provides a flexible plate adapted to be used in a winged coil structure for providing a function of magnetic induction and a flexible and bendable feature. The flexible plate is formed of a flexible substrate with electrical insulation and has a middle region and two side regions bordering the middle region. A notched line is provided on a lower surface of the flexible plate. The notched line has a trench recessing upwards or inwards such that the two side regions of the flexible plate are bendable upwards or downwards, and a dielectric layer of the winged coil structure is not extended to the notched line.

Another embodiment of the disclosure provides a winged coil structure for providing a function of magnetic induction and flexible and bendable feature. The winged coil structure has a wing shape with two thinner side parts than a middle part downwards projecting. The winged coil structure comprises the aforementioned flexible plate, at least one upper magnetic induction coil, at least one upper connection pad, a lower flexible plate, at least one lower magnetic induction coil, at least one lower connection pad, the aforementioned dielectric layer, and at least one connection plug. The at least one upper magnetic induction coil is embedded in the flexible plate and has a helical shape close to an upper surface of the flexible plate. The at least one upper connection pad is electrically connected with the corresponding upper magnetic induction coil. The lower flexible plate is formed of another flexible substrate with electrical insulation and has a middle region and two side regions bordering the middle region. The at least one lower magnetic induction coil is embedded in the lower flexible plate and has a helical shape close to a lower surface of the lower flexible plate. The at least one lower connection pad is electrically connected with the corresponding lower magnetic induction coil and vertically aligned to the corresponding upper connection pad. The dielectric layer is provided between the flexible plate and the lower flexible plate. The flexible plate is on an upper surface of the dielectric layer, and the lower flexible plate is beneath a lower surface of the dielectric layer. The at least one connection plug is formed of an electrically conductive metal material. The at least one connection plug is penetrating the dielectric layer and provided between the corresponding upper connection pad and lower connection pad. The at least one connection plug combines the at least one upper connection pad with the at least one lower connection pad, respectively. Wherein, the at least one upper magnetic induction coil and the at least one lower magnetic induction coil are separated by the dielectric layer, and the aforementioned notched line is provided along each adjacency of the lower surface of the flexible plate and the lower flexible plate.

In one embodiment, the middle region of the flexible plate has a first middle through-hole and the middle region of the lower flexible plate has a second middle through-hole. The at least one upper magnetic induction coil and the at least one lower magnetic induction coil are configured around the first middle through-hole of the flexible plate and the second middle through-hole of the lower flexible plate, respectively.

In one embodiment, the dielectric layer has at least one through-hole. The at least one through-hole is aligned to the at least one upper connection pad and the at least one lower connection pad, respectively.

In one embodiment, the winged coil structure further comprises at least one gold finger. The at least one gold finger is configured at the side regions of the flexible plate and electrically connected with the at least one lower magnetic induction coil.

Yet another embodiment of the disclosure provides a winged coil structure for providing a function of magnetic induction and a flexible and bendable feature. The winged coil structure has a wing shape with two thinner side parts than a middle part downwards projecting. The winged coil structure comprises the aforementioned flexible plate, at least one upper magnetic induction coil, at least one upper connection pad, a lower flexible plate, at least one lower magnetic induction coil, at least one lower connection pad, the aforementioned dielectric layer, at least one connection plug, a bottom flexible plate, at least one bottom magnetic induction coil, and at least one bottom connection pad. The at least one upper magnetic induction coil is embedded in the flexible plate and has a helical shape close to an upper surface of the flexible plate. The at least one upper connection pad is electrically connected with the corresponding upper magnetic induction coil. The lower flexible plate is formed of an another flexible substrate with electrical insulation and has a middle region and two side regions bordering the middle region. The at least one lower magnetic induction coil is embedded in the lower flexible plate and has a helical shape close to a lower surface of the lower flexible plate. The at least one lower connection pad is electrically connected with the corresponding lower magnetic induction coil and vertically aligned to the corresponding upper connection pad. The dielectric layer is provided between the flexible plate and the lower flexible plate. The flexible plate is on an upper surface of the dielectric layer and the lower flexible plate is beneath a lower surface of the dielectric layer. The at least one connection plug is formed of an electrically conductive metal material. The at least one connection plug is penetrating the dielectric layer and provided between the corresponding upper connection pad and lower connection pad. The at least one connection plug combines the at least one upper connection pad with the at least one lower connection pad, respectively. The bottom flexible plate is formed of a yet flexible substrate with electrical insulation and has a middle region and two side regions bordering the middle region. The at least one bottom magnetic induction coil is embedded in the bottom flexible plate and has a helical shape close to a lower surface of the bottom flexible plate. The at least one bottom connection pad is electrically connected with the corresponding bottom magnetic induction coil and vertically aligned to the at least one lower connection pad. Wherein, the at least one upper magnetic induction coil and the at least one lower magnetic induction coil are separated by the dielectric layer, and the aforementioned notched line is provided along each adjacency of the lower surface of the flexible plate and the lower flexible plate.

In one embodiment, the middle region of the flexible plate has a first middle through-hole, the middle region of the lower flexible plate has a second middle through-hole, and the middle region of the bottom flexible plate has a third middle through-hole. The at least one upper magnetic induction coil, the at least one lower magnetic induction coil, and the at least one bottom magnetic induction coil are configured around the first middle through-hole of the flexible plate, the second middle through-hole of the lower flexible plate, and the third middle through-hole of the bottom flexible plate, respectively.

In one embodiment, the dielectric layer has at least one through-hole. The at least one through-hole is aligned to the at least one upper connection pad and the at least one lower connection pad, respectively.

In one embodiment, the winged coil structure further comprises at least one gold finger. The at least one gold finger is configured at the side regions of the flexible plate and electrically connected with the at least one lower magnetic induction coil.

Further another embodiment of the disclosure provides a method of manufacturing a winged coil structure for providing a function of magnetic induction and a flexible and bendable feature. The method comprises preparing an upper flexible plate having a middle region and two side regions bordering the middle region, and provided with at least one upper magnetic induction coil, at least one upper connection pad, and at least one connection plug, the at least one upper magnetic induction coil and the at least one upper connection pad being electrically connected and embedded in the middle region of the upper flexible plate and close to an upper surface of the upper flexible plate, the at least one connection plug being provided on the lower surface of the middle region of the upper flexible plate and attached to a bottom of the corresponding upper connection pad; preparing a dielectric layer with a lateral size of the dielectric layer being the same as a lateral size of the middle region of the upper flexible plate; preparing a lower flexible plate having a middle region and two side regions bordering the middle region, and provided with at least one lower magnetic induction coil and at least one lower connection pad, the at least one lower magnetic induction coil and the at least one lower connection pad being electrically connected and embedded in the middle region of the lower flexible plate and close to a lower surface of the lower flexible plate; and performing a process of thermal pressing to sequentially from bottom to top stack and combine the lower flexible plate, the dielectric layer, and the upper flexible plate as a multiple layered stack structure via a press mold, the at least one connection plug being formed of an electrically conductive metal material, configured to penetrate the dielectric layer, and provided between the corresponding upper and lower connection pads such that the at least one connection plug combines the corresponding upper and lower connection pads after the process of thermal pressing to form electrical connection; wherein a notched line is provided along each adjacency of the lower surface of the upper flexible plate and the lower flexible plate, the notched line has a trench recessing upwards or inwards such that the two side regions of the upper flexible plate are bendable upwards or downwards, and the dielectric layer is not extended to the notched line.

In one embodiment, a middle through-hole is provided at the middle region of the upper flexible plate, at least one middle through-hole is provided at a middle region of the dielectric layer, and a middle through-hole is provided at the middle region of the lower flexible plate. The respective middle through-holes of the lower flexible plate, the dielectric layer, and the upper flexible plate are vertically aligned in the multiple layered stack structure. The at least one connection plug is configured to penetrate the at least one middle through-hole of the dielectric layer.

In one embodiment, the upper flexible plate is further provided with at least one gold finger, and the at least one gold finger is provided on lower surfaces of the two side regions of the upper flexible plate.

Yet still another embodiment the disclosure provides a method of manufacturing a winged coil structure for providing a function of magnetic induction and a flexible and bendable feature. The method comprises preparing an upper flexible plate having a middle region and two side regions bordering the middle region, and provided with at least one upper magnetic induction coil, at least one upper connection pad, and at least one connection plug, the at least one upper magnetic induction coil and the at least one upper connection pad being electrically connected and embedded in the middle region of the upper flexible plate and close to an upper surface of the upper flexible plate, the at least one connection plug being provided on the lower surface of the middle region of the upper flexible plate and attached to a bottom of the corresponding upper connection pad; preparing a dielectric layer with a lateral size of the dielectric layer being the same as a lateral size of the middle region of the upper flexible plate; preparing a lower flexible plate having a middle region and two side regions bordering the middle region, and provided with at least one lower magnetic induction coil and at least one lower connection pad, the at least one lower magnetic induction coil and the at least one lower connection pad being electrically connected and embedded in the middle region of the lower flexible plate and close to a lower surface of the lower flexible plate; preparing a bottom flexible plate attached to the lower surface of the lower flexible plate to form a stack body, the bottom flexible plate having a middle region and two side regions bordering the middle region, and provided with at least one bottom magnetic induction coil and the at least one bottom connection pad, the at least one bottom magnetic induction coil and the at least one bottom connection pad being electrically connected, embedded in the middle region of the bottom flexible plate, and close to a lower surface of the bottom flexible plate; and performing a process of thermal pressing to sequentially from bottom to top stack and combine the stack body, the dielectric layer, and the upper flexible plate as a multiple layered stack structure via a press mold, the at least one connection plug being formed of an electrically conductive metal material, configured to penetrate the dielectric layer, and provided between the corresponding upper and lower connection pads such that the at least one connection plug combines the corresponding upper and lower connection pads after the process of thermal pressing to form electrical connection; wherein a notched line is provided along each adjacency of the lower surface of the upper flexible plate and the lower flexible plate, the notched line has a trench recessing upwards or inwards such that the two side regions of the upper flexible plate are bendable upwards or downwards, and the dielectric layer is not extended to the notched line.

In one embodiment, a middle through-hole is provided at the middle region of the upper flexible plate, at least on middle through-hole is provided at a middle region of the dielectric layer, a middle through-hole is provided at the middle region of the lower flexible plate, and a middle through-hole is provided at the middle region of the bottom flexible plate. The respective middle through-holes of the bottom flexible plate, the lower flexible plate, the dielectric layer, and the upper flexible plate are vertically aligned in the multiple layered stack structure, and the at least one connection plug is configured to penetrate the at least one middle through-hole of the dielectric layer.

In one embodiment, the upper flexible plate is further provided with at least one gold finger, and the at least one gold finger is provided on lower surfaces of the two sides regions of the upper flexible plate.

In one embodiment, the method further comprises prior to the process of thermal pressing, supporting a bottom of the bottom flexible plate by an auxiliary stuff, wherein the auxiliary stuff is larger than or equal to the upper flexible plate and has two projecting parts at two ends aligned to the at least one gold finger, so that the two side regions of the upper flexible plate and the dielectric layer are supported by the auxiliary stuff during the process of thermal pressing; removing the auxiliary stuff after the process of thermal pressing; and covering a covering layer on the upper surface of the upper flexible plate, the lower surface of the lower flexible plate, and a surrounding area of the at least one gold finger, wherein the covering layer is formed of an electrical insulation material with transparency or opaqueness.

Since the upper and lower magnetic induction coils are close to the upper surface of the upper flexible plate and the lower surface of the lower flexible plate, respectively, the effect of magnetic induction is greatly enhanced with limited available area. Furthermore, the notched lines of the present invention help the two side regions of the flexible plate being easily bent upwards or downwards without damage to the upper and lower magnetic induction coils embedded. Thus, the application field of the present invention is widely expanded and industrial utility in the current market is obviously improved.

BRIEF DESCRIPTION OF THE DRAWINGS

The present invention will be apparent to those skilled in the art by reading the following detailed description of a preferred embodiment thereof, with reference to the attached drawings, in which.

DETAILED DESCRIPTION OF THE PREFERRED EMBODIMENT

The accompanying drawings are included to provide a further understanding of the invention, and are incorporated in and constitute a part of this specification. The drawings illustrate embodiments of the invention and, together with the description, serve to explain the principles of the invention.

Figure 1:
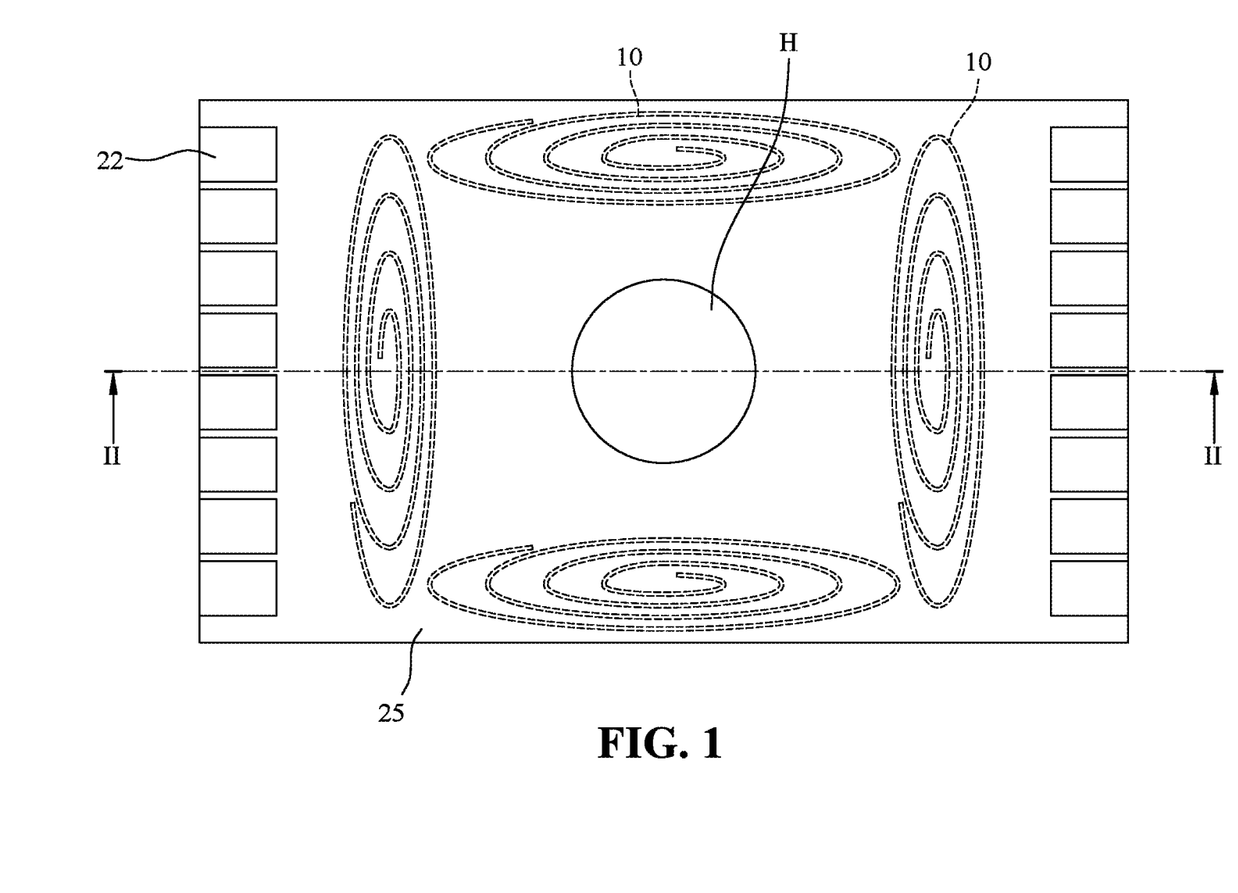
FIG. 1 is a top view showing a winged coil structure according to the first embodiment of the present invention.
Figure 2:
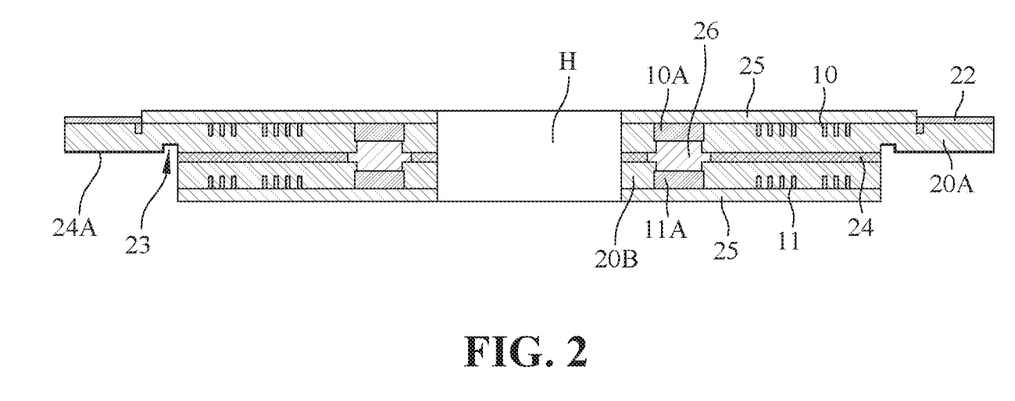
FIG. 2 is a cross sectional view showing the winged coil structure in FIG. 1.

Please refer to FIGS. 1 and 2. FIG. 1 illustrates a top view of the winged coil structure according to the first embodiment of the present invention, and FIG. 1 shows a cross sectional view of the winged coil structure. As shown in FIGS. 1 and 2, the winged coil structure of the first embodiment generally comprises at least one upper magnetic induction coil 10, at least one upper connection pad 10A, at least one lower magnetic induction coil 11, at least one lower connection pad 11A, an upper flexible plate 20A, a lower flexible plate 20B, at least one gold finger 22, a dielectric layer 24 and at least one connection plug 26.

The upper flexible plate 20A and the lower flexible plate 20B are formed of flexible substrates with electrical insulation material, respectively, like resin or plastic material. The dielectric layer 24 is provided between the upper flexible plate 20A and the lower flexible plate 20B. The upper flexible plate 20A is configured on an upper surface of the dielectric layer 24, and the lower flexible plate 20B is beneath a lower surface of the dielectric layer 24. In particular, the lateral size of the upper flexible plate 20A is larger than the lateral size of the lower flexible plate 20B. Thus, the winged coil structure of the first embodiment has a thicker middle part projecting downward and two thinner side parts bordering the middle part so as to form a shape of two wings.

In addition, the upper surface of the winged coil structure is smooth and planar, but the lower surface of the winged coil structure has a projecting middle area. The middle part of the winged coil structure has a middle through-hole H, and the dielectric layer 24 sandwiched between the upper flexible plate 20A and the lower flexible plate 20B is penetrated by the middle through-hole H.

Specifically, the at least one upper magnetic induction coil 10 and the at least one lower magnetic induction coil 11 are embedded in the upper flexible plate 20A and the lower flexible plate 20B, respectively, and configured close to the upper surface of the upper flexible plate 20A and the lower surface of the lower flexible plate 20B, respectively. Each of the upper magnetic induction coil 10 and the lower magnetic induction coil 11 has a helical shape, and is provided around the middle through-hole H and separated by the dielectric layer 24.

The at least one gold finger 22 is provided on the two side regions of the upper flexible plate 20A, and electrically connected with the corresponding upper magnetic induction coil 10. Each upper connection pad 10A is electrically connected with the corresponding upper magnetic induction coil 10, and each lower connection pad 11A is electrically connected with the corresponding lower magnetic induction coil 11. In particular, the upper connection pad 10A and the corresponding lower connection pad 11A are vertically aligned. Further, the dielectric layer 24 is provided with at least one through-hole, which is aligned to the corresponding upper connection pad 10A and corresponding lower connection pad 11A such that the upper connection pad 10A and the corresponding lower connection pad 11A are electrically connected via the connection plug 26, which fills up the through-hole of the dielectric layer 24.

It is preferred that the above connection plug 26 is formed of an electrically conductive metal material such as copper, tin copper alloy or tin alloy. Particularly, the connection plug 26 possesses workability of thermal pressing and has a shape of ball, column or block. In other words, the connection plug 26 is placed between the upper connection pad 10A and the corresponding lower connection pad 11A, or formed beneath the lower surface of the upper connection pad 10A, or attached to the lower surface of the upper connection pad 10A, and then a process of thermal pressing is performed to melt and press the connection plug 26 such that the connection plug 26, the upper connection pad 10A and the corresponding lower connection pad 11A are combined together.

Therefore, the gold finger 22, the upper magnetic induction coil 10, the upper connection pad 10A, the connection plug 26, the lower connection pad 11A and the lower magnetic induction coil 11 of the present embodiment are electrically connected in sequence.

The above upper magnetic induction coil 10, upper connection pad 10A, lower magnetic induction coil 11, lower connection pad 11A and gold finger 22 are formed of the same or different electrical conductive material like copper, copper alloy or gold, and the dielectric layer 24 is formed of a dielectric material.

As shown in FIG. 2, the adjacencies of the lower flexible plate 20B and the lower surface of the upper flexible plate 20A are provided with the respective notched lines 23, and each notched line 23 has a trench which recesses upwards or inwards such that the two side regions of the upper flexible plate 20A are bendable upwards or downwards. In particular, the dielectric layer 24 is not extended to the notched line 23. That is, the notched line 23 does not accommodate the dielectric layer 24. The winged coil structure thus possesses the bendable feature, provides the function of magnetic induction, and is applicable to the field of magnetic induction for coil.

Additionally, the base surfaces of the two side regions of the upper flexible plate 20A are attached to or covered by an external dielectric layer 24A, which is formed of the same or different dielectric material from the dielectric material of the dielectric layer 24, so as to provide isolation and protection.

The winged coil structure of the first embodiment may further comprise a covering layer 25, which is configure to cover the upper surface of the upper flexible plate 20A, the lower surface of the lower flexible plate 20B, and a surrounding area of the gold finger 22. Preferably, the covering layer 25 is formed of an electrical insulation material with transparency or opaqueness.

Figure 3:
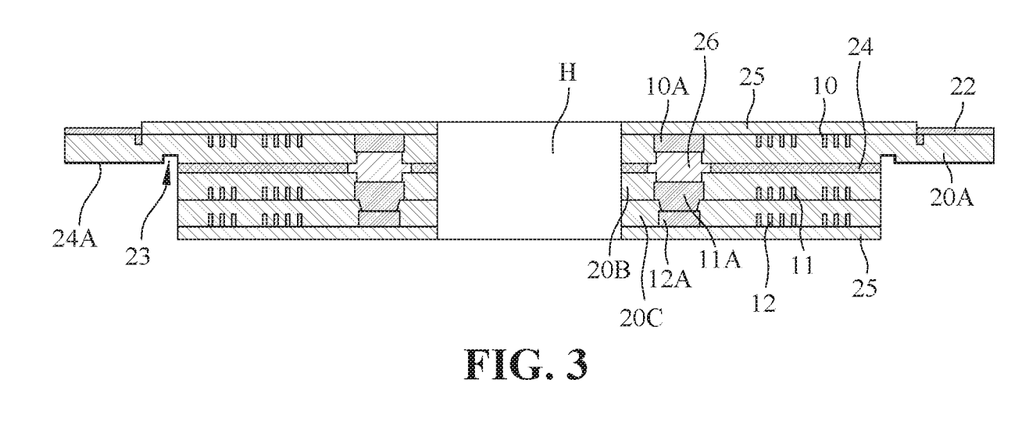
FIG. 3 is a cross sectional view showing a winged coil structure according to the second embodiment of the present invention.

Further refer to FIG. 3 showing a cross sectional view of the winged coil structure according to the second embodiment of the present invention. The winged coil structure according to the second embodiment is similar to the winged coil structure of the above first embodiment, and has the same features shown in FIG. 1, which are thus omitted.

As shown in FIG. 3, one of the primary differences between the second and first embodiments is that the winged coil structure of the second embodiment further comprises a bottom flexible plate 20C, at least one bottom magnetic induction coil 12 and at least one bottom connection pad 12A. The bottom flexible plate 20C is attached to the lower surface of the lower flexible plate 20B. The at least one bottom magnetic induction coil 12 and the at least one bottom connection pad 12A are electrically connected and embedded in the bottom flexible plate 20C, and configured close to the lower surface of the bottom flexible plate 20C. In particular, each bottom connection pad 12A is attached to the corresponding lower connection pad 11A. Additionally, the bottom flexible plate 20C and the lower flexible plate 20B are of the same lateral size.

Another difference is that the winged coil structure of the second embodiment may further comprise a covering layer 25, which is configured to cover the surrounding area of the gold finger, the upper surface of the upper flexible plate 20A, the lower surface of the bottom flexible plate 20C, instead of the covering layer 25 of the first embodiment covering the lower surface of the lower flexible plate 20B.

Therefore, in the winged coil structure of the second embodiment, the gold finger 22, the upper magnetic induction coil 10, the upper connection pad 10A, the connection plug 26, the lower connection pad 11A, the lower magnetic induction coil 11, the bottom connection pad 12A and the bottom magnetic induction coil 12 are electrically connected in sequence.

It should be noted that the winged coil structure of the second embodiment in FIG. 3 comprising the upper flexible plate 20A, the lower flexible plate 20B and the bottom flexible plate 20C as a three layers stack structure is just an illustrative example, not intended to limit the scope of the present invention. In other words, the present invention may substantially comprise one upper flexible plate 20A, one lower flexible plate 20B and more than one bottom flexible plate 20C.

Figure 4:
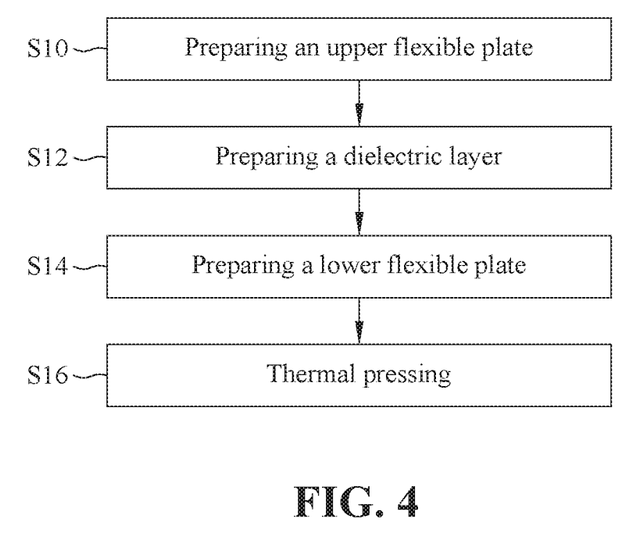
FIG. 4 is a flowchart showing a method of manufacturing the winged coil structure according to the third embodiment of the present invention.

Refer to FIG. 4 and FIGS. 5A to 5D. FIG. 4 shows a flowchart illustrating the method of manufacturing the winged coil structure according to the third embodiment of the present invention, and FIGS. 5A to 5D shows the respective views for the steps of the method according to the third embodiment of the present invention.

As shown in FIG. 4, the method of the third embodiment generally comprises the steps S10, S12, S14 and S16 for manufacturing the winged coil structure.

Figure 5A:
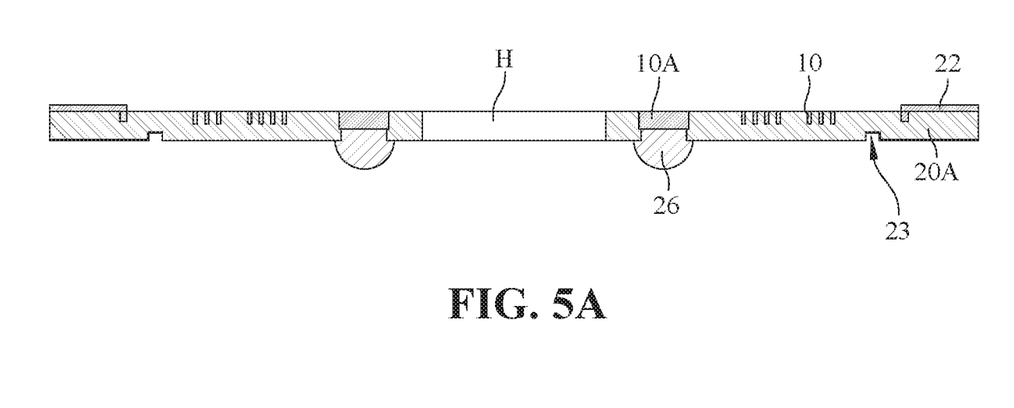
FIGS. 5A to 5D are views showing the respective steps of the method according to the third embodiment of the present invention.

First, the method of manufacturing the winged coil structure of the third embodiment begins at step S10, in which an upper flexible plate 20A as shown in FIG. 5A is prepared. The upper flexible plate 20A is provided with at least one upper magnetic induction coil 10, at least one upper connection pad 10A, at least one gold finger 22 and at least one connection plug 26. Further, the upper flexible plate 20A has a middle region and two side regions bordering the middle region, and the middle region is provided with a middle through-hole H.

Specifically, the upper magnetic induction coil 10 and the upper connection pad 10A are electrically connected and embedded in the middle region of the upper flexible plate 20A and close to the upper surface of the upper flexible plate 20A. The at least one gold finger 22 is provided on lower surfaces of the two side regions of the upper flexible plate 20A, and each connection plug 26 is provided on the lower surface of the middle region of the upper flexible plate 20A and attached to the bottom of the corresponding upper connection pad 10A. It is preferred that the connection plug 26 has a shape of ball, column or block, and is formed of copper, tin, copper alloy or tin alloy. In addition, the connection plug 26 has workability of thermal pressing, and is thus easily deformed through heating and pressing.

Further, each adjacency of the lower surface of the upper flexible plate 20A and the lower flexible plat 20B is provided with a notched line 23, which has a trench recessing upwards or inwards.

Figure 5B:
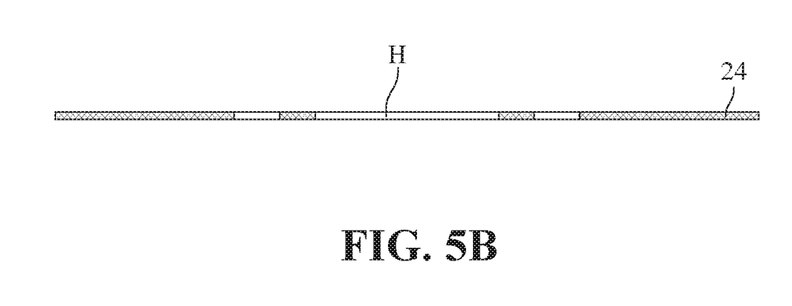
Figure 5C:
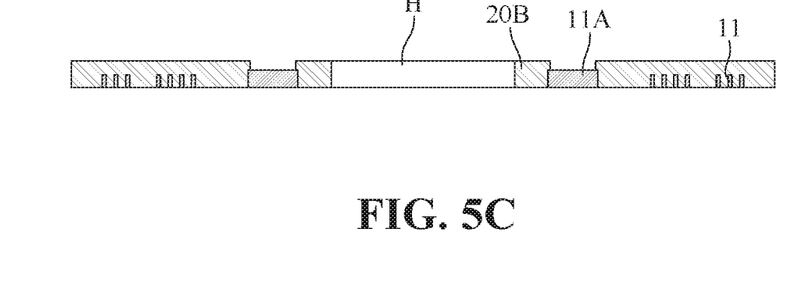

Next, in the step S12, a dielectric layer 24 is prepared as shown FIG. 5B with a lateral size the same as a lateral size of the middle region of the upper flexible plate 20A, and has a middle through-hole H in the middle region of the dielectric layer 24. The step S14 is then performed by preparing a lower flexible plate 20B as shown in FIG. 5C, which has a middle region provided with a middle through-hole H. At least one lower magnetic induction coil 11 and at least one lower connection pad 11A which are electrically connected are embedded in the lower flexible plate 20B, and particularly close to the lower surface of the lower flexible plate 20B.

Figure 5D:
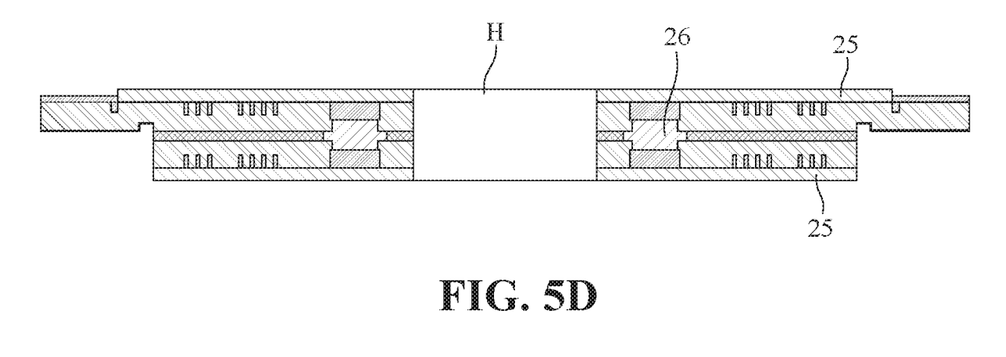

Finally, the lower flexible plate 20B, the dielectric layer 24 and the upper flexible plate 20A are sequentially stacked from bottom to top in the step S16 to form a multiple layers stack structure as shown in FIG. 5D, in which the respective middle through-holes H are aligned. The multiple layers stack structure is thermally pressed via a pressing mold. Especially, the connection plug 26 tightly combines the upper connection pad 10A and the lower connection pad 11A to implement good electrical connection.

Additionally, the method of the third embodiment may further comprise a step of forming a covering layer 25, which covers the surrounding area of the gold finger 22, the upper surface of the middle region of the upper flexible plate 20A and the lower surface of the lower flexible plate 20B. Thus, the winged coil structure as desired is implemented.

Figure 6:
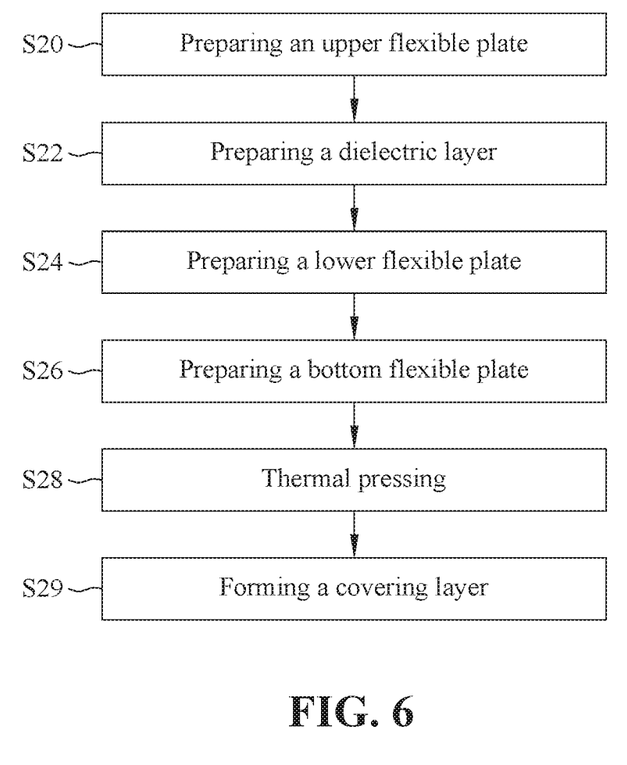
FIG. 6 is a flowchart showing a method of manufacturing the winged coil structure according to the fourth embodiment of the present invention.

Further refer to FIG. 6 and FIGS. 7A to 7E. FIG. 6 shows a flowchart illustrating the method of manufacturing the winged coil structure according to the fourth embodiment of the present invention, and FIGS. 7A to 7E shows the respective views for the steps of the method according to the fourth embodiment of the present invention.

Figure 7A:
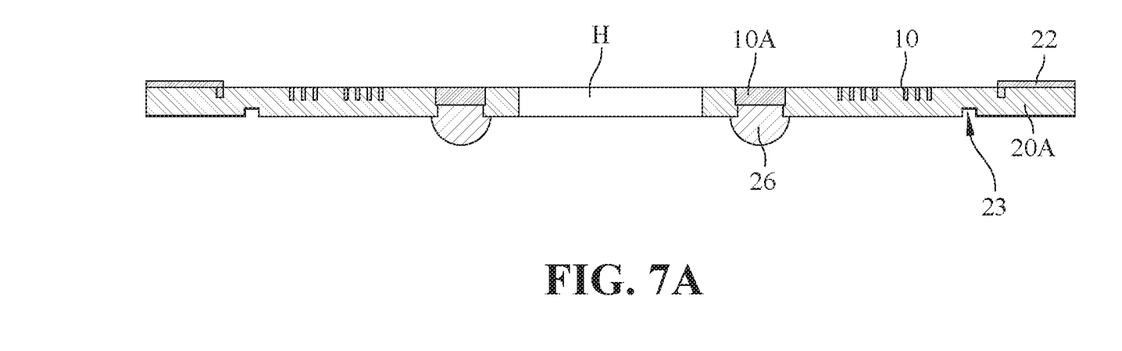
FIGS. 7A to 7E are views showing the respective steps of the method according to the fourth embodiment of the present invention.
Figure 7B:
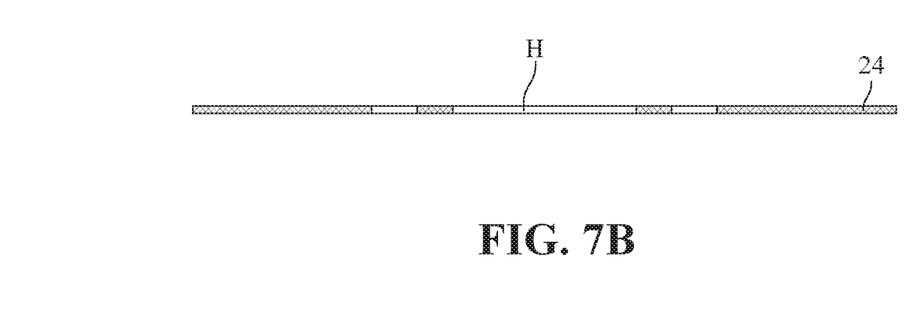
Figure 7C:
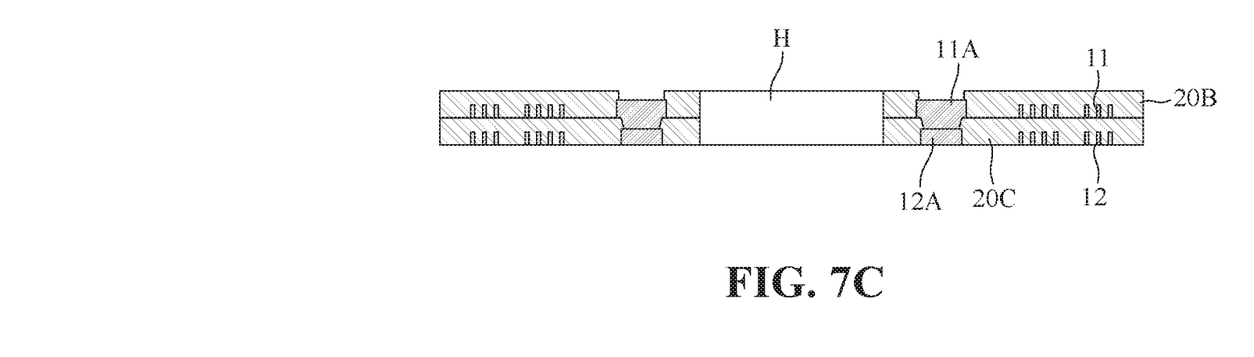

As shown in FIG. 6, the method of the fourth embodiment generally comprises the steps S20, S22, S24, S26 and S28 for manufacturing the winged coil structure, which are similar to the method of the third embodiment. The steps S20, S22 and S24 of the fourth embodiment are identical to the steps S10, S12 and S14 of the third embodiment for preparing the upper flexible plate 20A, the dielectric layer 24, and the lower flexible plate 20B, respectively, as shown in FIGS. 7A, 7B and 7C. Thus, the description is omitted hereinafter.

Specifically, the step S16 of the method of the fourth embodiment is performed by preparing the bottom flexible plate 20C as shown in FIG. 7C, which is attached to the lower surface of the lower flexible plate 20B to form a stack body. The bottom flexible plate 20C is similar to the lower flexible plate 20B, and has a middle region and two side regions bordering the middle region. Also, the bottom flexible plate 20C is provided with at least one bottom magnetic induction coil 12 and at least one bottom connection pad 12A. The middle region of the bottom flexible plate 20C has a middle through-hole H.

Figure 7D:
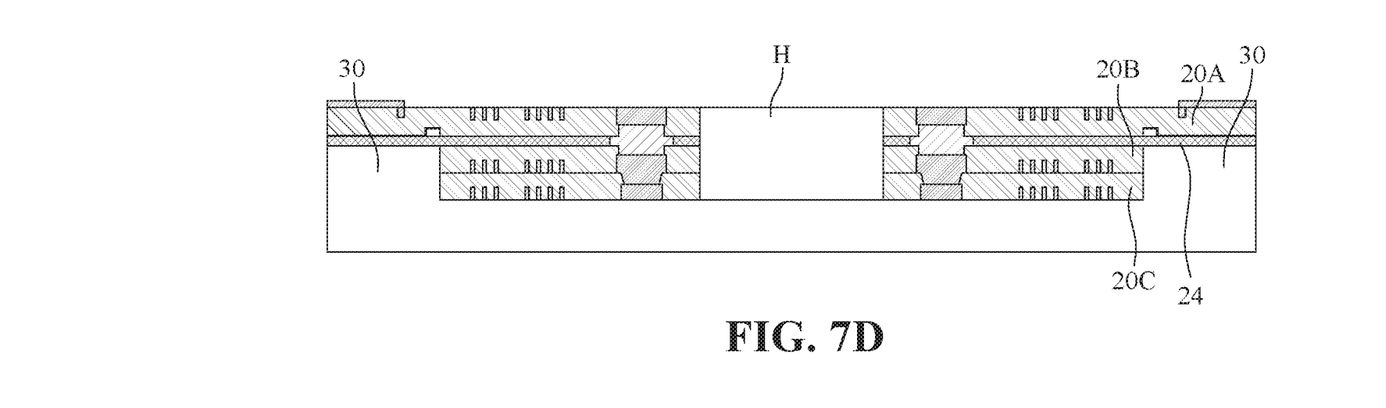

Finally, a multiple layers stack structure is formed in the step S28 through the process of thermal pressing, as shown in FIG. 7D. The above stack body, the dielectric layer 24 and the upper flexible plate 20A are sequentially stacked from bottom to top, and the respective through-holes H are aligned. Then, the pressing mold is employed under heating to press and combine the upper flexible plate 20A, the lower flexible plate 20B and the bottom flexible plate 20A 20C. Therefore, the connection plug 26 tightly combines the upper connection pad 10A and the lower connection pad 11A under thermal pressing to implement electrical connection.

Figure 7E:
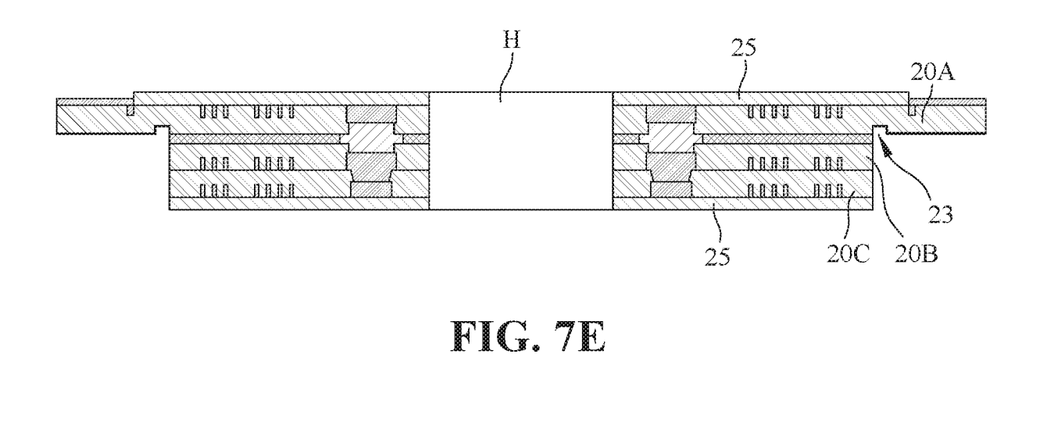

An addition step S29 is further included as shown in FIG. 7E to form a covering layer 25, which covers the upper surface of the middle region of the upper flexible plate 20A, the lower surface of the bottom flexible plate 20C and the surrounding area of the gold finger 22. As a result, the winged coil structure as desired is implemented.

Moreover, if the upper flexible plate 20A in FIG. 7A and the dielectric layer 24 in FIG. 7B are larger than the lower flexible plate 20B in FIG. 7C, the two side regions of the upper flexible plate 20A and the dielectric layer 24 are not supported by the lower flexible plate 20B and become floating during the process of thermal pressing in the step S28. As a result, the final structure is easily bent and deformed, and particularly, the gold finger 22 on the upper flexible plate 20A is seriously affected and the yield rate is greatly decreased. Therefore, to improve the yield rate, the bottom of the bottom flexible plate 20C is supported by an auxiliary stuff 30, which is larger than or equals the upper flexible plate 20A, and has two projecting parts at two ends as cushion aligned to the gold finger 22. Thus, the two side regions of the upper flexible plate 20A and the dielectric layer 24 are substantially supported so as to protect the gold finger 22. Next, as shown in FIG. 7E, the auxiliary stuff 30 is removed, and the upper surface of the upper flexible plate 20A and the lower surface of the bottom flexible plate 20C are covered by the covering layer 25.

Preferably, the above auxiliary stuff 30 is formed of silicone or pulp, and can be optionally covered by a release film, which helps directly remove the auxiliary stuff 30.

The gold finger 22, the upper magnetic induction coil 10, the upper connection pad 10A, the connection plug 26, the lower connection pad 11A, the lower magnetic induction coil 11, the bottom connection pad 12A and the bottom magnetic induction coil 12 in the method of the fourth embodiment are thus electrically connected in sequence.

From the above mention, one primary feature of the present invention is that the upper magnetic induction coil, the lower magnetic induction coil and the bottom magnetic induction coil are provided in the respective flexible plates and combined together after the process of thermal pressing such that the layout density of coil is greatly increased and the effect of magnetic induction is enhanced. As a result, the problem of alignment tolerance for the respective holes while combining the magnetic induction coil and the flexible plate for manufacturing traditional magnetic induction coil board in the prior arts is solved.

Another feature of the present invention is that the notched lines help the two side parts of the winged coil structure being bent upwards or downwards without damage to the upper, lower and the bottom magnetic induction coils embedded. Thus, the winged coil structure of the present invention may easily bend upwards or downwards depending on the actual geometrical demand, and is widely applied to various fields so as to greatly improve facility and reliability for subsequent assembly processes.

Furthermore, the connection plug of the present invention possesses workability of thermal pressing to tightly combine the respective connection pads, thereby implementing good electrical connection. The aspect of low manufacturing cost provided by the present invention is greatly advantageous to improve industrial utility in the current market.

Although the present invention has been described with reference to the preferred embodiments thereof, it is apparent to those skilled in the art that a variety of modifications and changes may be made without departing from the scope of the present invention which is intended to be defined by the appended claims.

What is claimed is:

1. A flexible plate adapted to be used in a winged coil structure for providing a function of magnetic induction and a flexible and bendable feature, wherein the flexible plate is formed of a flexible substrate with electrical insulation and has a middle region and two side regions bordering the middle region; wherein a notched line is provided on a lower surface of the flexible plate, the notched line has a trench recessing upwards or inwards such that the two side regions of the flexible plate are bendable upwards or downwards, and a dielectric layer of the winged coil structure is not extended to the notched line.

2. A winged coil structure for providing a function of magnetic induction and a flexible and bendable feature, and having a wing shape with two thinner side parts than a middle part downwards projecting, comprising:
   the flexible plate according to claim 1;
   at least one upper magnetic induction coil embedded in the flexible plate and having a helical shape close to an upper surface of the flexible plate;
   at least one upper connection pad electrically connected with the corresponding upper magnetic induction coil;
   a lower flexible plate formed of an another flexible substrate with electrical insulation and having a middle region and two side regions bordering the middle region;
   at least one lower magnetic induction coil embedded in the lower flexible plate and having a helical shape close to a lower surface of the lower flexible plate;
   at least one lower connection pad electrically connected with the corresponding lower magnetic induction coil, and vertically aligned to the corresponding upper connection pad;
   the dielectric layer provided between the flexible plate and the lower flexible plate, the flexible plate being on an upper surface of the dielectric layer, the lower flexible plate beneath a lower surface of the dielectric layer; and
   at least one connection plug formed of an electrically conductive metal material, the at least one connection plug penetrating the dielectric layer and provided between the corresponding upper connection pad and lower connection pad, the at least one connection plug combines the at least one upper connection pad with the at least one lower connection pad, respectively,
   wherein the at least one upper magnetic induction coil and the at least one lower magnetic induction coil are separated by the dielectric layer, and the notched line is provided along each adjacency of the lower surface of the flexible plate and the lower flexible plate.

3. The winged coil structure according to claim 2, wherein the middle region of the flexible plate has a first middle through-hole, the middle region of the lower flexible plate has a second middle through-hole, the at least one upper magnetic induction coil and the at least one lower magnetic induction coil are configured around the first middle through-hole of the flexible plate and the second middle through-hole of the lower flexible plate, respectively.

4. The winged coil structure according to claim 2, wherein the dielectric layer has at least one through-hole, the at least one through-hole is aligned to the at least one upper connection pad and the at least one lower connection pad, respectively.

5. The winged coil structure according to claim 2, further comprising at least one gold finger configured at the side regions of the flexible plate and electrically connected with the at least one lower magnetic induction coil.

6. A winged coil structure for providing a function of magnetic induction and a flexible and bendable feature, and having a wing shape with two thinner side parts than a middle part downwards projecting, comprising:
   the flexible plate according to claim 1;
   at least one upper magnetic induction coil embedded in the flexible plate and having a helical shape close to an upper surface of the flexible plate;

at least one upper connection pad electrically connected with the corresponding upper magnetic induction coil;

a lower flexible plate formed of an another flexible substrate with electrical insulation and having a middle region and two side regions bordering the middle region;

at least one lower magnetic induction coil embedded in the lower flexible plate and having a helical shape close to a lower surface of the lower flexible plate;

at least one lower connection pad electrically connected with the corresponding lower magnetic induction coil, and vertically aligned to the corresponding upper connection pad;

the dielectric layer provided between the flexible plate and the lower flexible plate, the flexible plate being on an upper surface of the dielectric layer, the lower flexible plate beneath a lower surface of the dielectric layer;

at least one connection plug formed of an electrically conductive metal material, the at least one connection plug penetrating the dielectric layer and provided between the corresponding upper connection pad and lower connection pad, the at least one connection plug combines the at least one upper connection pad with the at least one lower connection pad, respectively;

a bottom flexible plate formed of a yet flexible substrate with electrical insulation and having a middle region and two side regions bordering the middle region;

at least one bottom magnetic induction coil embedded in the bottom flexible plate and having a helical shape close to a lower surface of the bottom flexible plate; and at least one bottom connection pad electrically connected with the corresponding bottom magnetic induction coil, and vertically aligned to the at least one lower connection pad, wherein the at least one upper magnetic induction coil and the at least one lower magnetic induction coil are separated by the dielectric layer, and the notched line is provided along each adjacency of the lower surface of the flexible plate and the lower flexible plate.

7. The winged coil structure according to claim 6, wherein the middle region of the flexible plate has a first middle through-hole, the middle region of the lower flexible plate has a second middle through-hole, the middle region of the bottom flexible plate has a third middle through-hole, the at least one upper magnetic induction coil, the at least one lower magnetic induction coil, and the at least one bottom magnetic induction coil are configured around the first middle through-hole of the flexible plate, the second middle through-hole of the lower flexible plate, and the third middle through-hole of the bottom flexible plate, respectively.

8. The winged coil structure according to claim 6, wherein the dielectric layer has at least one through-hole, the at least one through-hole is aligned to the at least one upper connection pad and the at least one lower connection pad, respectively.

9. The winged coil structure according to claim 6, further comprising at least one gold finger configured at the side regions of the flexible plate and electrically connected with the at least one lower magnetic induction coil.

\* \* \* \* \*